Figure 1:
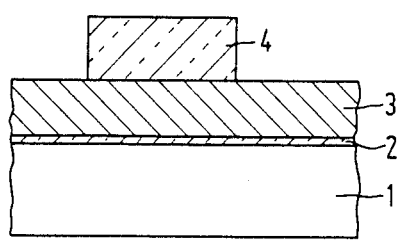

United States Patent [19]

Thijssen et al.

[11] Patent Number: 4,615,909
[45] Date of Patent: Oct. 7, 1986

[54] METHOD OF MANUFACTURING SEMICONDUCTOR DEVICES, IN WHICH MATERIAL IS DEPOSITED FROM A REACTION GAS, AND APPARATUS FOR CARRYING OUT SUCH A METHOD

[75] Inventors: Henri J. Thijssen; Antonius J. M. Uijen, both of Nijmegen, Netherlands; Paulus Z. A. M. Van der Putte, Sunnyvale, Calif.

[73] Assignee: U.S. Philips Corporation, New York, N.Y.

[21] Appl. No.: 723,122

[22] Filed: Apr. 15, 1985

[30] Foreign Application Priority Data

Apr. 17, 1984 [NL] Netherlands ............... 8401233

[51] Int. Cl.⁴ ........................................ H01L 21/314
[52] U.S. Cl. ........................... 427/82; 118/719;
118/725; 118/728; 427/86; 427/95
[58] Field of Search ............... 118/719, 725, 728;
427/95, 82, 86

[56] References Cited

U.S. PATENT DOCUMENTS

| | | | |
|---|---|---|---|
| 4,098,923 | 7/1978 | Albert | 427/95 |
| 4,232,063 | 11/1980 | Rosler | 118/725 |
| 4,275,094 | 6/1981 | Takagi | 427/93 |
| 4,309,240 | 1/1982 | Zuferes | 427/85 |
| 4,369,031 | 1/1983 | Goldman | 427/85 |
| 4,466,381 | 8/1984 | Jenkins | 427/95 |

Primary Examiner—John D. Smith
Attorney, Agent, or Firm—Paul R. Miller

[57] ABSTRACT

A number of wafer slices of semiconductor material are heated in a reactor tube arranged inside a furnace tube with the reactor tube having openings through which a reaction gas is passed for depositing semiconductor material on the wafer slices. This is effected by producing in the furnace tube a flow of reaction gas along the outer side walls of the reactor tube and by passing only a part of this flow through the openings into the reactor tube. By using this method, particles of large size and different composition, which may be formed in the reaction gas, are prevented from being deposited on the wafer slices.

13 Claims, 4 Drawing Figures

METHOD OF MANUFACTURING SEMICONDUCTOR DEVICES, IN WHICH MATERIAL IS DEPOSITED FROM A REACTION GAS, AND APPARATUS FOR CARRYING OUT SUCH A METHOD

The invention relates to a method of manufacturing semiconductor devices, in which a number of slices of semiconductor material are heated in a reactor tube arranged in a furnace tube and having a tube wall which is provided with openings through which a reaction gas is passed into the reactor tube for depositing a layer of material on the slices, after which residual gases are discharged through an open end of the reactor tube.

The invention further relates to an apparatus for carrying out such a method.

The method is particularly suitable for manufacturing semiconductor devices, in which, for example, layers of polycrystalline Si, $SiO_2$ or $Si_3N_4$ serve as a contact layer, as an insulation layer and as a masking layer, respectively, and in which stringent requirements are imposed, inter alia on the thickness and the composition of these layers. The layer is deposited in this method preferably at a pressure lower than atmospheric pressure in the reactor tube. Such a process is designated as a "low pressure chemical vapour deposition" process or briefly as an LPCVD process.

From U.S. Pat. No. 4,232,063 a method of the kind mentioned in the opening paragraph is known, in which the reaction gas is brought into contact with the slices in the reactor tube by passing a flow of reaction gas through the furnace tube and then via the openings in the tube wall through the reactor tube over the slices. The reactor tube then serves to produce a homogeneous distribution of the reaction gas over the slices and hence a homogeneous deposition of semiconductor material on the slices.

A disadvantage of the known method described is that especially in the proximity of the openings in the wall of the reactor tube, particles are deposited on the slices which have a composition different from that of the material to be applied. When silicon-containing layers, such as layers of polycrystalline silicon, silicon oxide or silicon nitride, are applied, in which process silane or dichlorosilane, if required with an addition of an oxygen- or a nitrogen-containing compound, is used as reaction gas, the silicon particles can contain hydrogen, chlorine and, as the case may be, oxygen or nitrogen. The parts of the layer in which the particles that occur can therefore vary considerably as to thickness and composition from those parts in which these particles do not occur or occur to a considerably lesser extent. The presence of the undesired particles can readily be observed because parts of the layer in which they occur have a dull appearance (polycrystalline Si) or discolorations ($SiO_2$, $Si_3N_4$) instead of a shining appearance.

The invention has inter alia for its object to provide a method of the kind mentioned in the opening paragraph, which makes possible the deposition on a number of slices of semiconductor material of a layer of semiconductor material in which the occurrence of particles having a different composition is considerably reduced.

The invention is based on the recognition of the fact that the particles having a different composition are obtained by reactions occurring in the case of collisions between gas molecules in the reaction gas and that it is possible by a suitable conduction of the reaction gas to prevent these particles from being deposited on the slices.

For this purpose, according to the invention, the method mentioned in the opening paragraph is characterized in that the reaction gas is passed to the slices in the reactor tube by producing in the furnace tube a flow of the reaction gas along the outer side of the wall of the reactor tube and by passing only a part of this flow through the openings in the tube wall into the reactor tube. Experiments have shown that the slices do not or substantially do not exhibit discolorations or dull spots due to this measure and that therefore the deposition of particles having a different composition on the slices is considerably reduced. It is presumed that the comparatively large particles are taken along by the flow of gas along the outer side of the wall of the reactor tube and that therefore a comparatively small number of large particles from the flow of gas and a comparatively large number of smaller molecules from the reaction gas will enter the reactor tube through the openings in the wall. As a result, the gas entering the reactor tube is comparatively poor in large particles, not only in comparison with the gas flowing along the wall of the reactor tube, but especially also in comparison with the gas which is passed through the reactor tube in the known method described. Since in the method according to the invention, the slices further are arranged at a small distance from the openings in the wall of the reactor tube and since moreover the reaction gas inside the reactor tube has a comparatively low density, the possibility that particles are still formed in the reaction gas before the gas reaches the slices is small. As a result, the gas reaching the slices is also poor in large particles so that their deposition on the slices is strongly reduced.

A preferred embodiment of the method according to the invention is characterized in that a dense screen is arranged inside the reactor tube in front of the openings in the tube wall. In a very practical embodiment of the method according to the invention, this dense screen is constituted by a closed side of a slice carrier. The openings in the wall of the reactor tube are then screened as soon as a slice carrier is placed in position in the reactor tube. This results in that the deposition of large particles on the slices is even further reduced. Moreover, such a screen, which is removed from the furnace together with the slices on which a layer is deposited, can readily be cleaned.

The invention further relates to an apparatus for carrying out such a method, which apparatus is provided with a reactor tube which is arranged inside a furnace tube and in which a number of slices of semiconductor material can be heated by means of a heating element arranged outside the furnace tube with this reactor tube being provided with a tube wall having openings for passing reaction gas into the reactor tube and having an open end for discharging residual gases. According to the invention, this arrangement is characterized in that the reactor tube is further provided with a closed end which is located opposite to the open end and which during operation is directed in a direction opposite to that of the flow of reaction gas to be passed through the furnace tube. Thus, the desired flow of gas can be simply produced along the outer side of the wall of the reactor tube. Preferably, the reactor tube is detachably arranged in the furnace tube so that both tubes can be cleaned in a simple manner.

Figure 2:
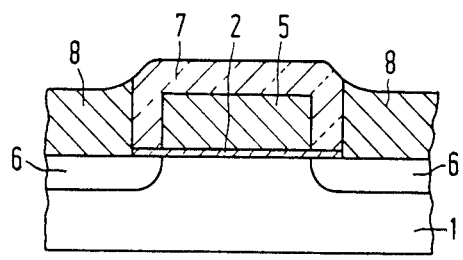
Figure 3:
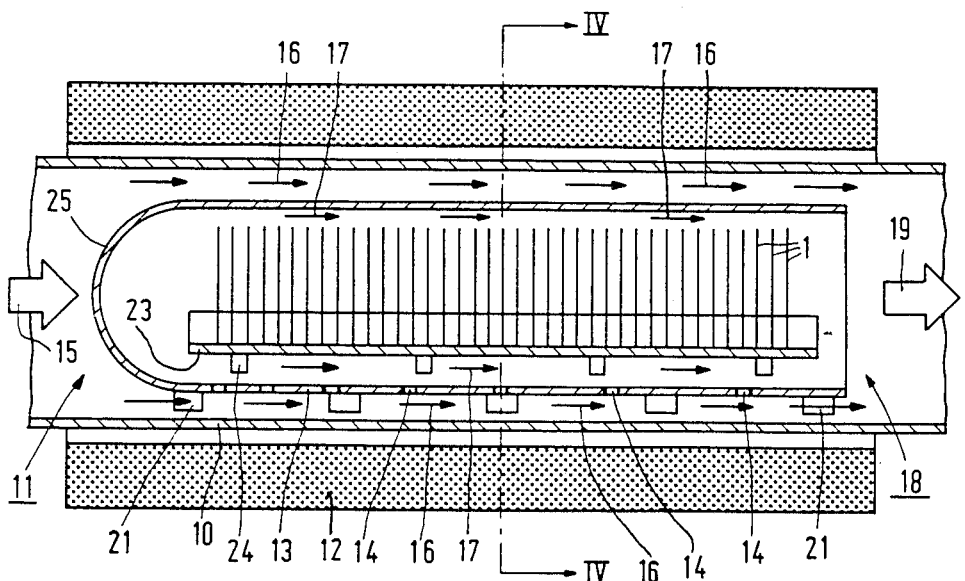
Figure 4:
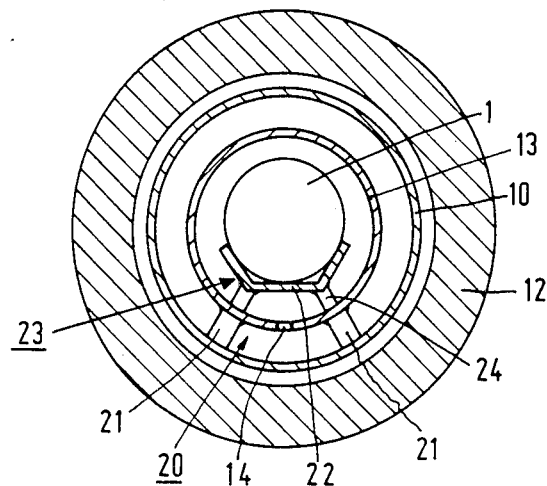

The invention will now be described more fully, by way of example, with reference to the drawings. In the drawing Figures:

FIGS. 1 and 2 show successive stages in the manufacture of a semiconductor device by means of the method according to the invention, FIG. 3 is a longitudinal sectional view of an arrangement for carrying out the method according to the invention, and FIG. 4 shows a cross-section of the arrangement shown in FIG. 3 taken on the line IV—IV.

The Figures are schematic and not drawn to scale, while corresponding parts are designated by the same reference numerals.

FIGS. 1 and 2 show in cross-section successive stages in the manufacture of a semiconductor device by means of a method according to the invention. The starting material is a slice of p-type silicon 1 having a doping concentration of approximately $10^{16}$ atoms per $cm^3$. In a usual manner, an approximately 20 nm thick layer of gate oxide 2 is thermally deposited thereon. By means of the method according to the invention, an approximately 0.5 μm thick layer 3 of polycrystalline Si is grown thereon. For this purpose, at a pressure of approximately 50 Pa 50 SCC of $SiH_4$ (SCC = Standard CC = 1 cc at normal temperature and pressure) and 100 SCC of Ar, in which 0.2 SCC of $PH_3$ is present, are passed per minute through the reactor. In the reactor, seventy slices are arranged at a relative distance of approximately 4.2 mm, which are all heated to a temperature of approximately 600° C., after which phosphorus-doped polycrystalline silicon is deposited thereon at a rate of approximately 3.5 nm per minute. After a thermal treatment at approximately 1000° C., the layer of polycrystalline silicon has a resistance of approximately 1.0 to 1.7 mΩ.cm. The layer 3 has a variation in thickness of approximately ±3% per slice and also of approximately ±3% over all the seventy slices. Due to the absence of dull spots, it is evident that particles having a composition different from that of polycrystalline silicon substantially do no occur on the slices. By means of a conventional photolacquer mask 4, the layer of polycrystalline silicon 3 is now etched into a pattern 5. Subsequently, source and drain regions 6 of the n-conductivity type having a doping concentration of approximately $10^{19}$ atoms per $cm^3$ are provided in a usual manner by means of ion implantation and a thermal treatment. After a layer 7 insulating the pattern 5 has been provided in a usual manner, for example, by oxidizing the polycrystalline silicon, and after conductors 8 have been formed, a field effect transistor is obtained.

Before the deposition of the layer of polycrystalline silicon 3, a number of slices 1—in the arrangement shown in FIGS. 3 and 4—are heated in a reactor tube 11 arranged inside a furnace tube 10 by means of a heating element 12 shown diagrammatically. The reactor tube 11 has a tube wall 13 which is provided with openings 14, through which a reaction gas indicated by the arrow 15 is passed to the slices 1 for the deposition of the layers of semiconductor material 2, 3 and 4. According to the invention, this is effected in that in the furnace tube 10 a flow of the reaction gas indicated by the arrows 16 is produced along the outer side of the wall 13 of the reactor tube 11 and only a part indicated by the arrows 17 of this flow 16 is passed through the openings 14 in the tube wall 13 into the reactor tube 11. The reactor tube 11 has an open end 18, through which residual gases are discharged from the reactor tube 11. Together with gas remaining from the flow 16 directed along the wall 13, the residual gases from the reactor tube 11, as indicated by the arrow 19, are removed from the furnace tube 10.

In the reaction gas 15 and especially at the area at which it is heated inside the furnace tube 10 by the heating element 12, larger particles can be formed by reactions occurring due to collisions between gas molecules. These particles can contain silicon, hydrogen, chlorine and, as the case may be, oxygen or nitrogen. Deposition of particles of this kind on the slices 1 is undesirable. It appears from the fact that dull spots substantially do not occur in the layer of polycrystalline silicon which is deposited in the arrangement according to the invention on the slices 1 that the undesired particles do not or substantially not penetrate into the reactor tube 11. Apparently, a comparatively small number of undesired large particles from the gas flow 16 along the wall 13 enter the reactor tube 11 through the openings 14. Since further the slices 1 are arranged at a small distance from the openings 14 and since the gas 17 inside the reactor tube 11 has a low density with a small possibility of collisions between the gas molecules, the possibility is small that still undesired large particles are formed in the gas before this gas reaches the slices 1.

The deposition of large undesired particles on the slices 1 can be further counteracted in that in front of the openings 14 in the tube wall 13 there is arranged a dense screen, which is a very practical embodiment of the method according to the invention is a closed side 22 of a slice carrier 23. The reactor tube 11 is arranged substantially horizontally, while the openings 14 in the tube wall 13 are arranged only on the lower side 20 substantially in one line extending in the longitudinal direction of the reactor tube 11. The reactor tube 11 is provided with pedestals 21, by which it bears on the wall of the furnace tube 10. The slice carrier 23 is provided with feet 24 on which it stands in the reactor tube 11. The openings 14 are now screened as soon as the slice carrier 23 is placed in position in the reactor tube 11.

The openings 14 in the tube wall 13 are preferably provided in such a size and at such a relative distance that an equally thick layer is deposited on all the slices 1 if a constant temperature is adjusted, viewed in the longitudinal direction of the reactor tube. Thus, a single heating element 12 is sufficient so that the temperature of the slices 1 can also be adjusted in a simple manner. Moreover, layers deposited on all slices at the same temperature have substantially the same grain size.

The gas flow 16 can be conducted in different ways along the wall 13 of the reactor tube 11. For example, the reactor tube and the furnace tube may be interconnected by flanges in a manner such that a closed space is formed between the two tubes. By means of separate supply and discharge leads, a flow of the reaction gas may then be passed through this closed space. However, it is much more practical to provide the reactor tube 11 with a closed end 25 located remote from the open end 18. This end 25 is directed during operation in a direction opposite to the direction of the flow of reaction gas 15 to be passed through the furnace tube 10. The desired gas flow 16 is then automatically formed in the space enclosed by the two tubes 10 and 11.

The reactor tube 11 and the slice carrier 23 should preferably be cleaned. For this purpose, the reactor tube 11 is detachably arranged in the furnace tube 10 and the slice carrier 23 is detachably arranged in the reactor tube 11.

The invention is of course not limited to the above embodiment, but many variations are possible for those skilled in the art without deparating from the scope of the invention. For example, the furnace tube 10 and the reactor tube 11 are shown as circular tubes, but they may of course also have a square, a rectangular or a different cross-section. In the examples, silicon-containing layers were deposited on a silicon substrate, but the method and the arrangement according to the invention are also particularly suitable to deposit layers of compounds of elements from the groups III and V and II and VI of the periodic system of elements.

Wha is claimed is:

1. A method of manufacturing semiconductor devices comprising
    arranging a number of wafer slices of semiconductor material on a slice carrier boat in a reactor tube having a plurality of openings, said openings being arranged only below said slice carrier boat,
    heating said wafer slices of semiconductor material by a furnace tube surrounding said reactor tube,
    passing a reaction gas into said reactor tube to deposit a layer of material onto said wafer slices by producing a flow of said reaction gas along the outer side of said reaction tube within said furnace tube and by passing only a part of said flow into said reactor tube through said openings, and
    discharging residual gases through an open end of said reactor tube.

2. A method according to claim 1, wherein said slice carrier boat forms a dense screen in front of said openings.

3. A method according to claim 2, wherein said dense screen is constituted by a closed side of said slice carrier boat.

4. A method according to claim 1 or claim 2 or claim 3, wherein said openings are arranged substantially along one line extending longitudinally of said reactor tube.

5. A method according to claim 4, wherein said openings have a size and spacing from one another to deposit an equally thick layer on all of said wafer slices at a constant temperature in the longitudinal direction of said reactor tube.

6. A method according to claim 1 or claim 2 or claim 3, wherein said openings have a size and spacing from one another to deposit an equally thick layer on all of said wafer slices at a constant temperature in the longitudinal direction of said reactor tube.

7. An apparatus for manufacturing semiconductor devices comprising
    a furnace tube including means for heating,
    a reactor tube arranged inside said furnace tube, said reactor tube having a closed end, an open end, and a plurality of openings along said reactor tube,
    a slice carrier boat for holding a number of wafer slices of semiconductor material in said reactor tube, said openings being arranged only below said slice carrier boat, and
    means for passing a reaction gas through said furnace tube around said reactor tube, said reaction gas flowing past said closed end, partially through said openings into said reactor tube, over said wafer slices, and out said open end to discharge residual gases.

8. An apparatus according to claim 7, wherein said slice carrier boat forms a dense screen in front of said openings.

9. An apparatus according to claim 8, wherein said dense screen is constituted by a closed side of said slice carrier boat.

10. An apparatus according to claim 7 or claim 8 or claim 9, wherein said openings extend longitudinally along one line of said reactor tube.

11. An apparatus according to claim 7, wherein said reactor tube is detachably arranged within said furnace tube.

12. An apparatus according to claim 7, or claim 11, wherein said slice carrier boat is detachably arranged within said reactor tube.

13. An apparatus according to claim 12, wherein said slice carrier boat has a closed side above said openings.

* * * * *